(12) United States Patent
Inoue

(10) Patent No.: US 6,249,162 B1
(45) Date of Patent: Jun. 19, 2001

(54) HYSTERESIS CIRCUIT

(75) Inventor: Koichi Inoue, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 08/242,881

(22) Filed: May 16, 1994

(30) Foreign Application Priority Data

May 17, 1993 (JP) .................................................. 5-114856

(51) Int. Cl.⁷ .................................................. H03K 3/037
(52) U.S. Cl. .................................................. 327/205; 327/73
(58) Field of Search .................................... 327/205, 206, 327/72, 73, 561, 363, 323, 78, 77

(56) References Cited

U.S. PATENT DOCUMENTS

| | | | |
|---|---|---|---|
| 4,359,649 | * 11/1982 | Mündel | 327/205 |
| 4,751,405 | * 6/1988 | Bufano, Jr. et al. | 327/205 |
| 4,926,068 | * 5/1990 | Fujita | 327/205 |
| 4,977,336 | * 12/1990 | Martiny | 327/205 |
| 5,049,766 | * 9/1991 | van Driest et al. | 327/269 |
| 5,122,680 | * 6/1992 | Stakely et al. | 327/206 |
| 5,231,316 | * 7/1993 | Thelen, Jr. | 327/103 |
| 5,313,114 | * 5/1994 | Poletto et al. | 327/205 |
| 5,319,265 | * 6/1994 | Lim | 327/205 |
| 5,369,319 | * 11/1994 | Good et al. | 327/73 |

* cited by examiner

Primary Examiner—Toan Tran
(74) Attorney, Agent, or Firm—Arent Fox Kintner Plotkin & Kahn, PLLC

(57) ABSTRACT

A hysteresis circuit has a comparator which compares a threshold voltage and an input voltage. The threshold voltage is supplied from a voltage dividing circuit having resistors. A constant current circuit is connected to a voltage divided point of the voltage dividing circuit through a switch. The ON and OFF of the switch is controlled by an output of the comparator. When the switch is turned ON, a constant current flows to the voltage divided point, so that the value of the threshold voltage supplied from the voltage dividing circuit to the comparator is changed.

1 Claim, 4 Drawing Sheets

HYSTERESIS CIRCUIT

BACKGROUND OF THE INVENTION

1. Field of the Invention

The present invention relates to a hysteresis circuit which varies a threshold level for inverting the condition of an output according to the condition of the output, the hysteresis being suitable, for example, for determining a power supply condition.

2. Description of the Prior Art

Referring to FIG. 1, there is shown a conventional hysteresis circuit. Reference numerals 1, 2 and 3 represent resistors connected in series to serve as a voltage divider for dividing a reference voltage $V_{ref}$ supplied from a constant voltage circuit not affected by temperature variation. Reference numeral 4 represents a comparator which compares with an input voltage a potential at a voltage divided point a between the resistors 1 and 2 as a reference level, i.e. as a threshold level. Reference numeral 5 represents a switching transistor which varies the threshold level of the comparator 4 in order that the input and output characteristic of the comparator 4 has hysteresis.

The collector and emitter lines of the switching transistor 5 are respectively connected to a voltage divided point between the resistors 2 and 3 and to ground so that the transistor 5 is turned ON and OFF by a feedback circuit 6 according to the output condition of the comparator 4. Specifically, based on the output from the feedback circuit 6, the switching transistor 5 is OFF when the output of the comparator 4 is of low level and is ON when the output of the comparator 4 is of high level.

Hence, a threshold level $V_{p1}$ when the switching transistor 5 is ON is obtained by $$V_{p1} = \frac{R2(V_{ref} - V_{sat})}{R1 + R2} + V_{sat}$$

where R1, R2 and R3 represent the resistance values of the resistors 1, 2 and 3, and $V_{sat}$ represents a collector-emitter voltage of a saturation when the transistor 5 is ON.

A threshold level $V_{p2}$ when the switching transistor 5 is OFF is obtained by $$V_{p2} = \frac{(R2 + R3)V_{ref}}{R1 + R2 + R3}$$

Hence, when the output of the comparator 4 is not of high level, the switching circuit 5 is turned OFF, so that the threshold level is set to $V_{p2}$. For this reason, when the voltage input to the comparator 4 increases to above $V_{p2}$ under this condition, the output of the comparator 4 is inverted from low level to high level. Since, after the output is inverted to high level, the switching circuit 5 is turned ON so that the threshold level is set to $V_{p1}$, which is lower than $V_{p2}$, the output of the comparator 4 does not inverted from high level to low level until the input voltage decreases to below $V_{p1}$ (See FIG. 2).

A maximum hysteresis width ΔV of input and output characteristic of the comparator 4 is obtained by $$\Delta V = |V_{p1} - V_{p2}|$$

$$= \left| \frac{R2(V_{ref} - V_{sat})}{R1 + R2} + V_{sat} - \frac{(R2 + R3)V_{ref}}{R1 + R2 + R3} \right|$$

Thus, the maximum hysteresis width ΔV is set so that the output does not vibrate due to noise components superposed on the input voltage.

However, in this conventional hysteresis circuit, since the threshold level is varied by connecting a voltage divided point b between the resistors 2 and 3 serving as a voltage divider to ground through the collector and emitter lines of the switching transistor 5, the setting of the maximum hysteresis width ΔV includes the saturation voltage $V_{sat}$ of the transistor 5 which varies according to the temperature. As a result, the maximum hysteresis width ΔV varies according to the temperature.

Moreover, since the saturation voltage $V_{sat}$ of the transistor 5 is difficult to control, it is difficult to finely set the maximum hysteresis width ΔV.

SUMMARY OF THE INVENTION

An object of the present invention is to provide a hysteresis circuit capable of temperature-compensating a maximum hysteresis width and finely setting the temperature-compensated maximum hysteresis width.

To achieve the above-mentioned object, according to the present invention, a hysteresis circuit which varies a threshold level for inverting an output condition in accordance with the output condition is provided with a comparator which resistance divides a reference voltage and compares with an input voltage a potential at the voltage divided point as a threshold level, and a setting circuit which varies the setting of the threshold level by flowing a constant current into the voltage divided point or by drawing it from the voltage divided point according to an output condition of the comparator.

According to the hysteresis circuit of the present invention, since the temperature-compensated threshold level is set exactly based on the voltage divider and constant current which are easy to control, the maximum hysteresis width decided by the threshold level is finely set and temperature-compensated. When the hysteresis circuit thus structure is used, for example, in a power supply system which supplies power to a microcomputer to determine the power supply condition of the power supply system, the determination is minutely performed according to the power supply specifications of the microcomputer without affected by temperature variation.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Hereinafter, an embodiment of a hysteresis circuit of the present invention will be described with reference to the drawings.

Figure 3:
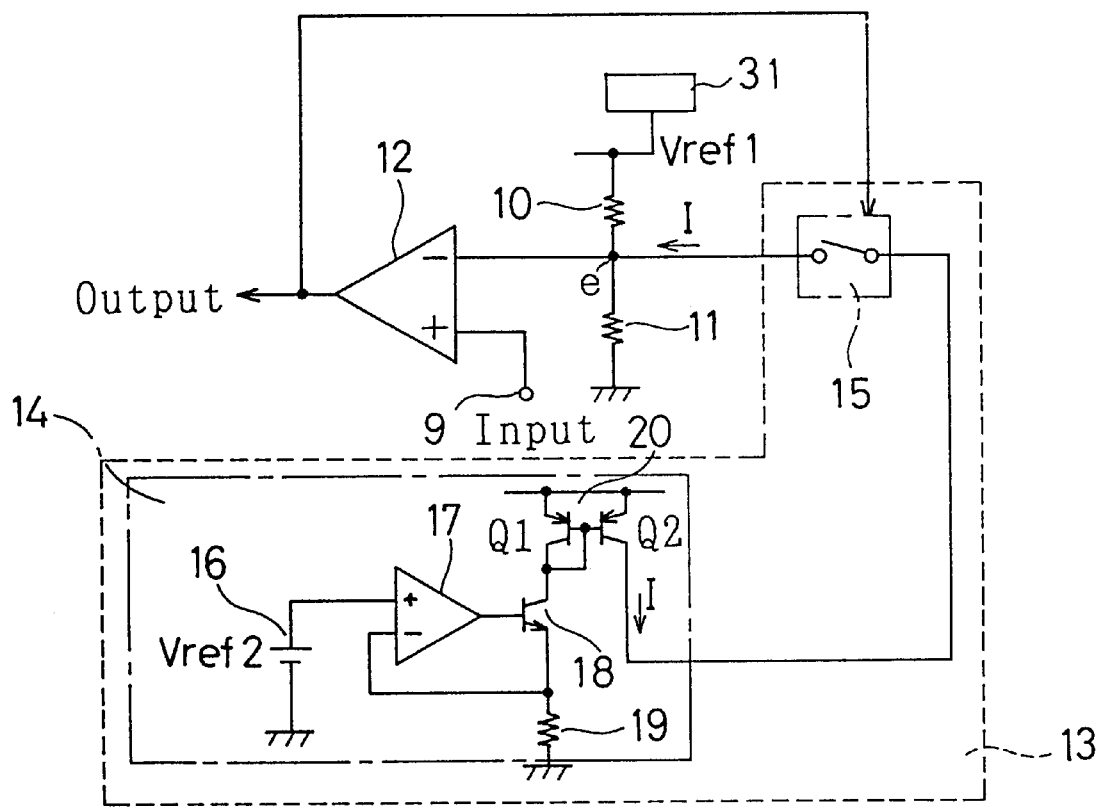
FIG. 3 shows an example of a hysteresis circuit of the present invention.

Referring to FIG. 3, reference numerals 10 and 11 represent resistors connected in series to serve as a voltage divider for dividing a reference voltage $V_{ref}$ from a constant voltage circuit 31 not affected by temperature variation. Reference numeral 12 represents a comparator which compares with an input voltage a potential at a voltage divided point e between the resistors 10 and 11 as a threshold level. The impedance at the input of the comparator 12 to which the potential at the voltage divided point e is applied is large. The input voltage of the comparator 12 is provided through a terminal 9. Reference numeral 13 represents a threshold level setting circuit which varies the setting of threshold level of the comparator 12 so that the input and output characteristic of the comparator 12 has hysteresis. The setting circuit 13 supplies a constant current to the voltage divided point between the resistors 10 and 11 according to the output condition of the comparator 12.

The setting circuit 13 includes a constant current circuit 14 and a switching circuit 15 which is turned ON and OFF according to the output condition of the comparator 12 and supplies a constant current I from the constant current circuit 14 to the voltage divided point e when it is ON. The switching circuit 15 is turned ON when the output of the comparator 12 is of low level and turned OFF when the output of the comparator 12 is of high level.

Reference numeral 16 represents a reference voltage source (e.g. band gap reference voltage source) which outputs a temperature-compensated reference voltage $V_{ref}2$. Reference numeral 17 represents a comparator with a feedback which controls a current flowing to the collector of a transistor 18 to be constant. Reference numeral 19 represents a resistor which converts a current into a voltage. Reference numeral 20 represents a current mirror circuit comprising PNP transistors Q1 and Q2. The resistors 10, 11 and 19 are interfaced with one another so that the nonuniformity of resistance values thereamong caused by temperature variation and during manufacture process are canceled in an integrated circuit (IC) or in a discrete structure.

A threshold level $V_p'$ when the switching circuit 15 is ON is obtained by $$V_p' = \frac{R2' \cdot V_{ref}1 \cdot IR1' \cdot R2'}{R1' + R2'}$$

where R1', R2' and $R_x$ represent the resistance values of the resistors 10, 11 and 19, and I represents the constant current from the constant current circuit 14.

A threshold level $V_p''$ when the switching circuit 15 is OFF is obtained by $$V_p'' = \frac{R2' \cdot V_{ref}1}{R1' + R2'}$$

Figure 1:
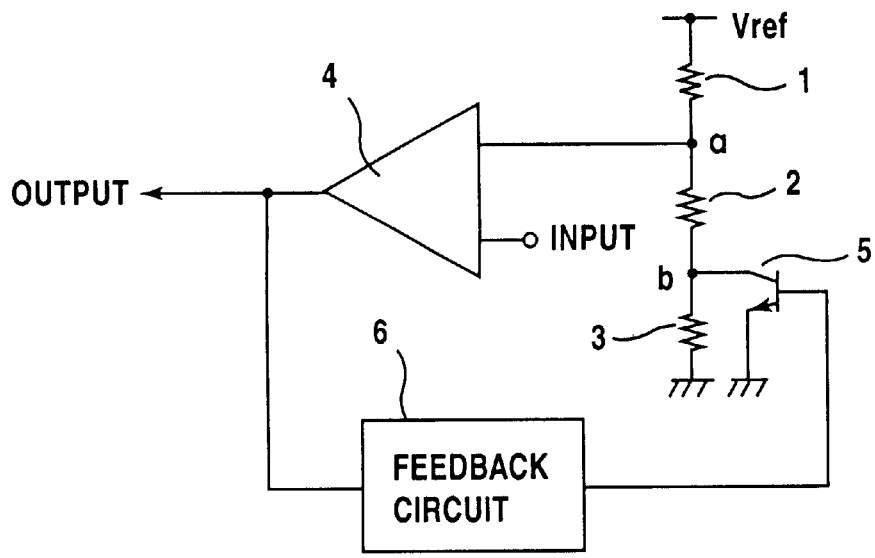
FIG. 1 shows a conventional hysteresis circuit.
Figure 2:
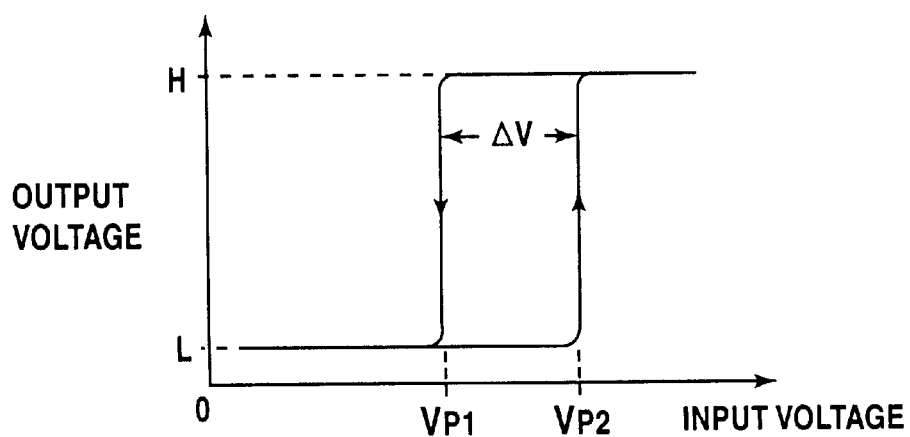
FIG. 2 shows an output characteristic of the conventional hysteresis circuit of FIG. 1.

Hence, when the output of the comparator 12 is not of high level, the switching circuit 15 is turned ON, so that the threshold level is set to $V_p'$ (corresponding to $V_{p2}$ in FIG. 2). For this reason, when the voltage input to the comparator 12 increases to above $V_p'$ under this condition, the output of the comparator is inverted from low level to high level. Since, after the output is inverted to high level, the switching circuit 15 is turned OFF so that the threshold level is set to $V_p''$ (corresponding to $V_{p1}$ in FIG. 2) which is lower than $V_p'$, the output of the comparator 12 does not inverted from high level to low level until the input voltage decreases to below $V_p''$.

A maximum hysteresis width $\Delta V_p$ (corresponding to $\Delta V$ in FIG. 2) of input and output characteristic of the comparator 12 is obtained by $$\Delta V_p = V_p' - V_p''$$

$$= \frac{IR1' \cdot R2'}{R1' + R2'}$$

Since I is represented by $I=V_{ref}2/R_x$, $$\Delta V_p = \frac{R1' \cdot R2' \cdot V_{ref}2}{(R1' + R2')R_x}$$

Since the maximum hysteresis width $\Delta V$ is thus set based on the temperature-compensated reference voltage $V_{ref}$ and the resistors 10, 11 and 19 interfaced with one another, it is not affected by temperature variation and resistance nonuniformity. Moreover, the maximum hysteresis width $\Delta V$ is set exactly and freely by the resistors 10, 11 and 19 which are easy to control. The hysteresis circuit of FIG. 3 is formed as a one-chip semiconductor integrated circuit device.

Figure 4:
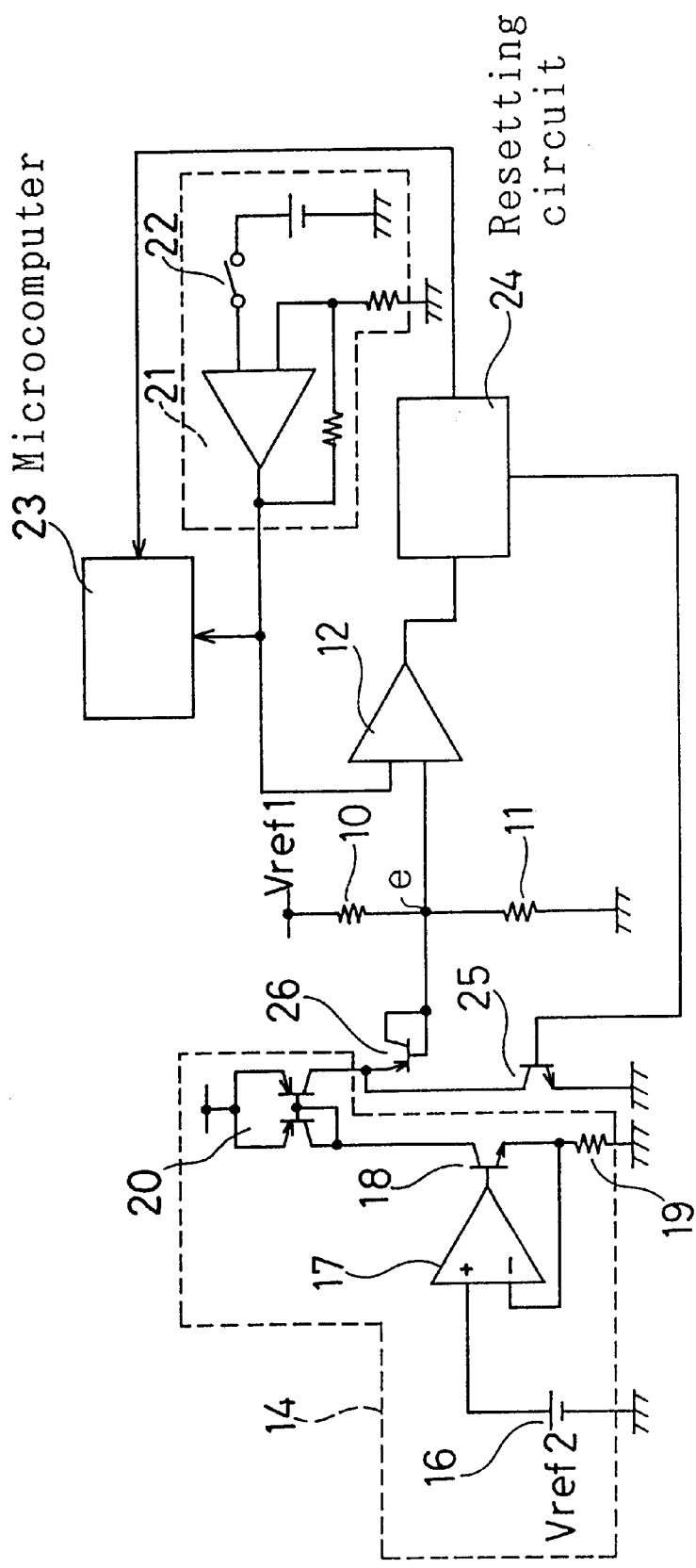
FIG. 4 shows an example of a power supply system using the hysteresis circuit of FIG. 3.

Referring now to FIG. 4 in which the hysteresis circuit thus structured is used in a power supply system which supplies power to a microcomputer to determine the power supply condition of the power supply system, reference numeral 21 represents a constant current circuit which provides supply voltage to a microcomputer 23 when a power switch 22 is turned on. The supply voltage is also provided to the comparator 12 constituting the hysteresis circuit as the input voltage.

Reference numeral 24 represents a resetting circuit connected to an output terminal of the comparator 12. The resetting circuit 24 resets the microcomputer 23 according to the output condition of the comparator 12 and varies the setting of threshold level of the comparator 12. Specifically, the resetting circuit 24 resets the microcomputer 23 when the output of the comparator 12 is of low level and sets the threshold level to $V_p'$ which is higher than $V_p''$ by disabling a transistor 25 and thereby activating a transistor 26 to output the constant current from the constant current circuit 14 to the voltage divided point e. Reference numeral 26 represents a diode connected transistor, which together with the transistor 25 constitutes the switching circuit 15 of FIG. 3.

When the power switch 22 is turned on to start power supply to the microcomputer 23, the voltage input to the comparator 12 increases accordingly. When the input voltage exceeds $V_p'$, the output of the comparator 12 is inverted from low level to high level. Receiving this output, the resetting circuit 24 activates the microcomputer 23 and activates the transistor 25 to disable the transistor 26, so that the threshold level is set to $V_p''$ which is lower than $V_p'$. When the power supply provided to the microcomputer 23 decreases to below $V_p''$ under this condition, for example due to breakdown, the output of the comparator 12 is inverted from high level to low level, so that, determining that the power supply is not normally performed, the resetting circuit 24 resets the microcomputer 23.

Figure 5:
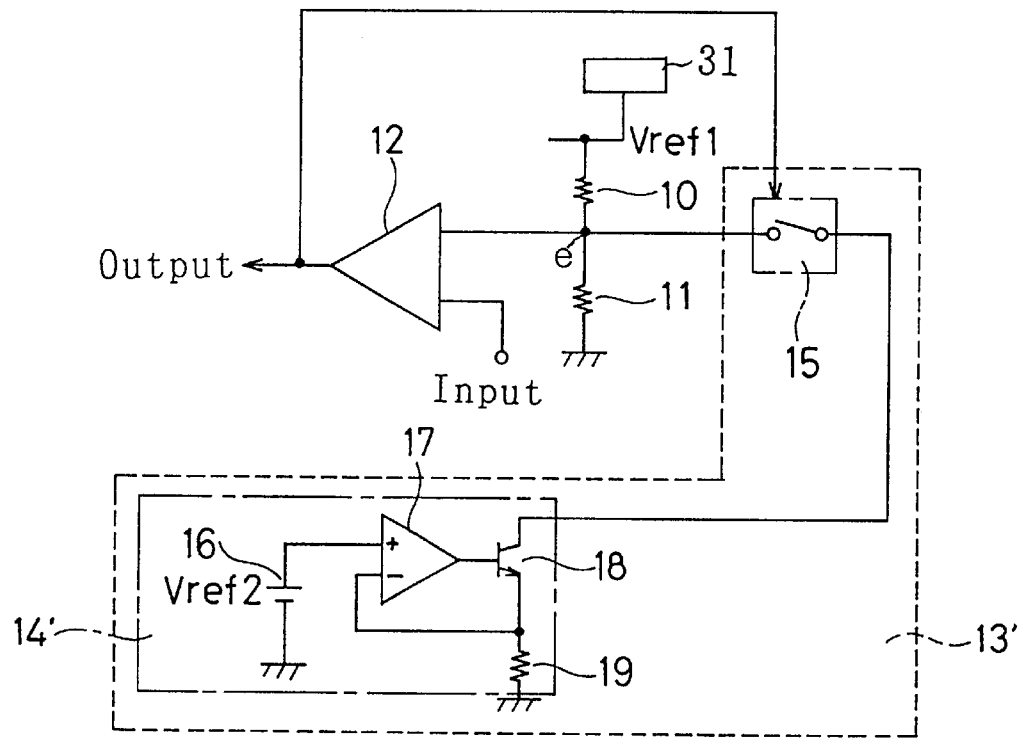
FIG. 5 shows another embodiment of the present invention.

While the setting of the threshold level is varied by supplying a constant current to the voltage divided point e according to the output condition of the comparator 12 in FIGS. 3 and 4, a setting circuit 13' having a constant current circuit 14' as shown in FIG. 5 may be provided to vary the setting of the threshold level by drawing a constant current from the voltage divided point e. In this arrangement, the threshold level when the switching circuit 15 is ON is lower than the threshold level when the switching circuit 15 is OFF, and the switching circuit 15 is ON when the output of the comparator 12 is inverted from low level to high level.

Figure 6:
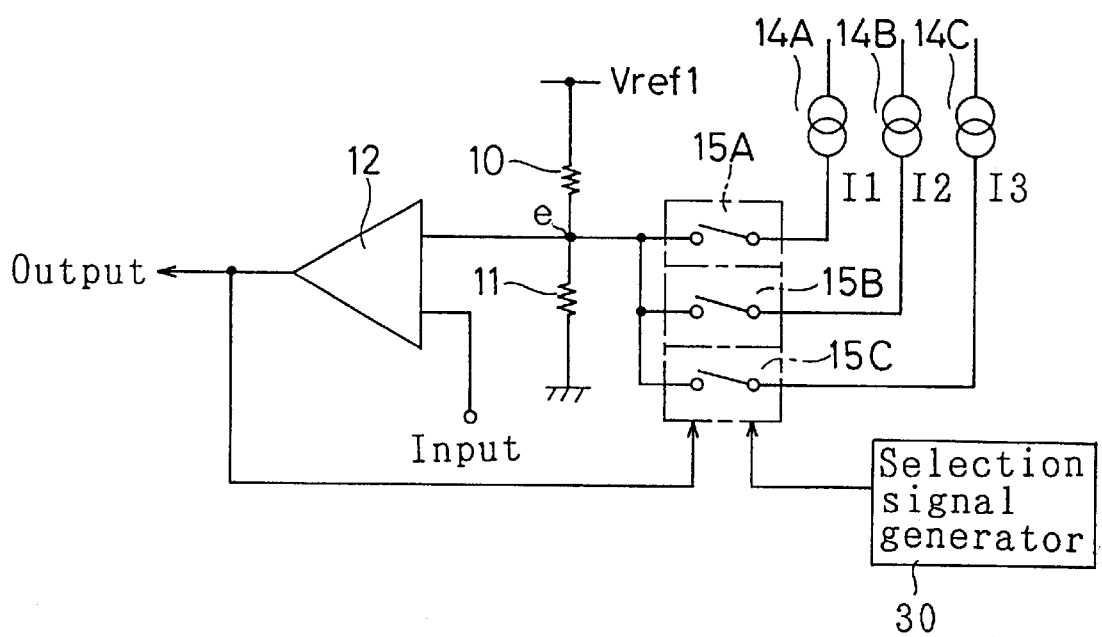
FIG. 6 shows still another embodiment of the present invention.

Moreover, a plurality of constant current circuits 14A, 14B and 14C and switching circuits 15A, 15B and 15C may be provided as shown in FIG. 6 to decide which of constant currents I1, I2 and I3 is flowed to the voltage divided point e according to the output of the comparator 12. In this arrangement, the maximum hysteresis width can be selected among a plurality of kinds. The selection of the maximum hysteresis width among the plurality of kinds may be performed by the changeover among a plurality of resistors serving as a voltage divider. This applies to the case of FIG. 5 where a constant current is drawn from the voltage divided point e. Reference numeral 30 represents a selection signal generator which generates a signal for selecting one of the switching circuits 15A, 15B and 15C. Which switching circuit is selected is decided, for example, by an operation member. While the transistors used in FIGS. 3, 4 and 5 are bipolar transistors, they may be MOS (metal oxide semiconductor) transistors.

As described above, according to the hysteresis circuit of the present invention, since the temperature-compensated threshold level is set exactly based on the resistor type voltage divider and constant current which are easy to control, the maximum hysteresis width decided by the threshold level is finely set and temperature-compensated. When the hysteresis circuit thus structured is used, for example, in a power supply system which supplies power to a microcomputer to determine the power supply condition of the power supply system, the determination is minutely performed according to the power supply specifications of the microcomputer without affected by temperature variation.

Obviously, many modifications and variations of the present invention are possible in light of the above teachings. It is therefore to be understood that within the scope of the appended claims, the invention may be practiced other than as specifically described.

What is claimed is:

1. A hysteresis circuit comprising:

a voltage dividing circuit which outputs a voltage resulting from a division of a reference voltage by resistors;

a comparator is provided with a) said output voltage of the voltage dividing circuit as a threshold voltage and b) an input voltage;

a constant current circuit which converts a temperature-compensated reference voltage into a current using a resistor; and a switching circuit being ON and OFF are controlled according to an output of the comparator, said switching circuit being set to an ON condition where a constant current output from the constant current circuit is provided to the voltage dividing circuit and being set to an OFF condition where the constant current is not provided to the voltage dividing circuit, wherein an output voltage of the voltage dividing circuit differs between when the constant current is provided to the voltage dividing circuit and when the constant current is not provided to the voltage dividing circuit, so that the threshold level of the comparator differs; and wherein said constant current flows so that a current is drawn from a voltage divided point of the voltage dividing circuit into the constant current circuit.

* * * * *